(12) United States Patent
Basin et al.

(10) Patent No.: US 7,791,093 B2
(45) Date of Patent: Sep. 7, 2010

(54) LED WITH PARTICLES IN ENCAPSULANT FOR INCREASED LIGHT EXTRACTION AND NON-YELLOW OFF-STATE COLOR

(75) Inventors: Grigoriy Basin, San Francisco, CA (US); Ashim Shatil Haque, San Jose, CA (US); Ching-hui Chen, San Jose, CA (US); Robert Scott West, Morgan Hill, CA (US); Paul Martin, Pleasanton, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 482 days.

(21) Appl. No.: 11/849,930

(22) Filed: Sep. 4, 2007

(65) Prior Publication Data

US 2009/0057699 A1 Mar. 5, 2009

(51) Int. Cl.
*H01L 33/00* (2010.01)
(52) U.S. Cl. .................................................. 257/98
(58) Field of Classification Search .............. 257/88, 257/512, 117, 432–437, 749, E33.056–E33.059, 257/E25.032; 250/336.1; 313/503, 512; 438/25–28
See application file for complete search history.

(56) References Cited

U.S. PATENT DOCUMENTS

| | | | |
|---|---|---|---|
| 6,340,824 B1 | 1/2002 | Komoto et al. | |
| 6,614,179 B1 | 9/2003 | Shimizu et al. | |
| 7,342,357 B2* | 3/2008 | Sakano et al. | 313/512 |
| 2004/0094757 A1 | 5/2004 | Braune et al. | |
| 2005/0194609 A1* | 9/2005 | Furukawa et al. | 257/100 |
| 2005/0224829 A1 | 10/2005 | Negley et al. | |
| 2007/0018102 A1* | 1/2007 | Braune et al. | 250/336.1 |
| 2007/0264492 A1 | 11/2007 | Mizuno et al. | |
| 2008/0116467 A1 | 5/2008 | Mueller et al. | |
| 2009/0050911 A1* | 2/2009 | Chakraborty | 257/89 |

FOREIGN PATENT DOCUMENTS

| | | | |
|---|---|---|---|
| EP | 1198016 A2 | 4/2002 | |
| EP | 1369935 A1 | 12/2003 | |

* cited by examiner

*Primary Examiner*—Dao H Nguyen
*Assistant Examiner*—Tram H Nguyen

(57) ABSTRACT

In one embodiment, sub-micron size granules of $TiO_2$, $ZrO_2$, or other white colored non-phosphor inert granules are mixed with a silicone encapsulant and applied over an LED. In one experiment, the granules increased the light output of a GaN LED more than 5% when the inert material was between about 2.5-5% by weight of the encapsulant. Generally, a percentage of the inert material greater than 5% begins to reduce the light output. If the LED has a yellowish YAG phosphor coating, the white granules in the encapsulant make the LED appear whiter when the LED is in an off state, which is a more pleasing color when the LED is used as a white light flash in small cameras. The addition of the granules also reduces the variation of color temperature over the view angle and position over the LED, which is important for a camera flash and projection applications.

16 Claims, 4 Drawing Sheets

LED WITH PARTICLES IN ENCAPSULANT FOR INCREASED LIGHT EXTRACTION AND NON-YELLOW OFF-STATE COLOR

FIELD OF INVENTION

This invention relates to light emitting diodes (LEDs) and, in particular, to techniques for improving light extraction. This invention also relates to creating a non-yellow off-state color of an LED having a yellowish phosphor coating.

BACKGROUND

A semiconductor LED, such as a GaN LED, has an index of refraction (e.g., n=2.2-3.0 for GaN) that is much higher than that of air (n=about 1). By encapsulating the LED in a transparent material, such as silicone (n=1.4-1.76), having an intermediate index of refraction, the light extraction is significantly increased. The encapsulant also protects the semiconductor LED die. It is desirable to further increase the light extraction.

High power LEDs are now commonly used as flashes in small cameras, including cell phone cameras. The LEDs emit a white light. Such LEDs used as flashes are typically one or more GaN LED dies that emit blue light covered by a layer of yttrium aluminum oxide garnet (YAG) phosphor that emits a yellow-green light when energized by the blue light. The combination of the blue light leaking through the YAG phosphor and the yellow-green light produces white light.

The YAG phosphor coating on the LED appears yellow-green under white ambient light when the LED is off. Such a yellow-green color is generally not attractive and typically does not match well with the appearance of the camera. It is desirable to somehow eliminate the yellow-green color of the flash in its off state.

SUMMARY

In one embodiment, granules of TiOx, ZrOx, or other white non-phosphor inert material are mixed with the substantially transparent encapsulant for LEDs. One suitable encapsulant is silicone. It has been discovered by the Applicants that sub-micron size particles of the inert material, such as $TiO_2$, in the encapsulant increase the brightness (lumens) of a GaN LED greater than 5% when the inert material is between about 2.5-5% (by weight) of the encapsulant. Generally, a higher percentage of the inert material begins to reduce the light output. Such a small quantity of the particles into the encapsulant produced surprising results that surpassed any results predicted by the inventors. A range of $TiO_2$ in the encapsulant from 0.5%-10% generally increases the brightness, depending on the actual LED used. A higher percentage begins to significantly reduce the transmission through the encapsulant.

Both titanium dioxide and zirconium oxide are used as white pigments in paints and enamels. A color considered to be white has a range of color temperatures, and the color is affected by the viewing light. The term white, as used in the present disclosure, appears to an observer as substantially white under sunlight.

The light enhancement achieved by the addition of the particles in the encapsulant occurs whether the LED is coated with a phosphor or not coated with a phosphor.

Adding the $TiO_2$ to the encapsulant, in some experiments, slightly reduces the color temperature of the emitted light when the LED is on, which is not significant. However, the addition of the $TiO_2$ greatly reduces (e.g., by two-thirds) the variation of color temperature over the entire 180 degree emission angle. This is important in photography since the entire subject is illuminated with substantially uniform light.

Further, adding the $TiO_2$ to the encapsulant also improves the color temperature uniformity across the package. This is especially important when optics are use that project an enlarged image of the LED, such as with a flashlight or projector.

Since the inert material (e.g., $TiO_2$ or $ZrO_2$) is white, the appearance of the LED with a YAG phosphor coating appears much whiter when the LED is off, which is more pleasing than the yellow-green color of the YAG phosphor.

In one embodiment, the flash LED module uses a silicone encapsulant with about 5% by weight of $TiO_2$, where the encapsulant is formed to have a flat surface so as not to significantly affect the shape of the LED emission (i.e., the encapsulant does not form a lens). The camera includes a lens over the flash to control the light emission pattern of the flash. In another embodiment, the silicone encapsulant may be molded into a lens to shape the light emission pattern.

BRIEF DESCRIPTION OF THE DRAWINGS

Elements that are similar or identical in the various figures are labeled with the same numeral.

DETAILED DESCRIPTION

Figure 1:
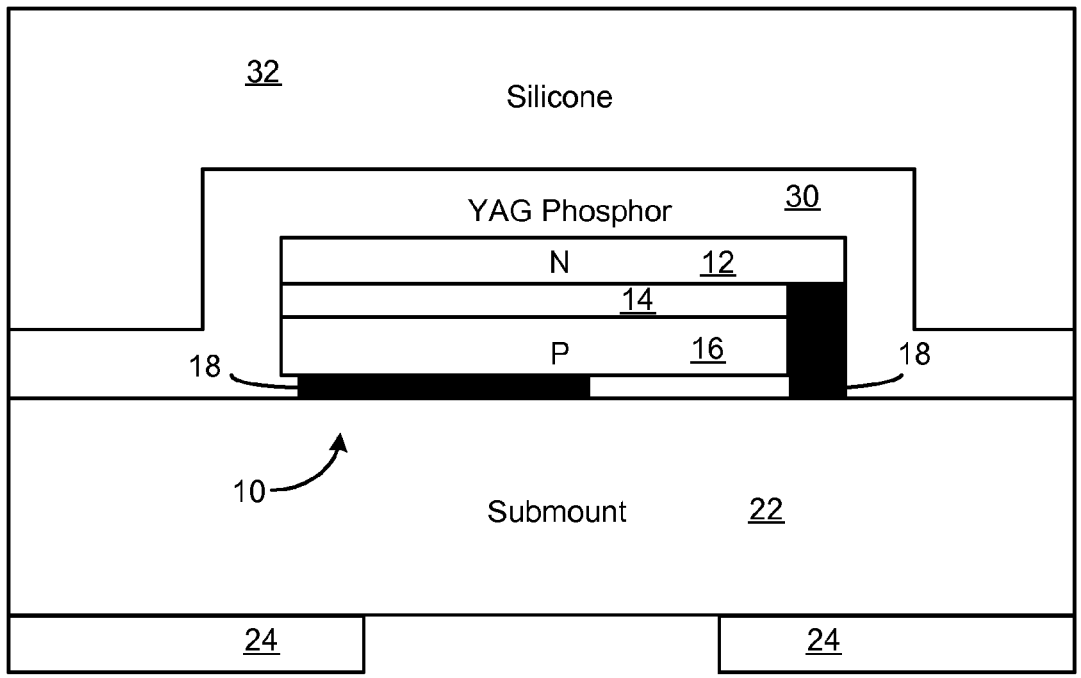
FIG. 1 is a cross-sectional view of a prior art flash LED comprising a blue LED die, a YAG phosphor coating, a submount, and a silicone encapsulant.

Although the invention can be applied to any type of LED, one particular LED will be described in detail that is used in all examples. FIG. 1 is a cross-sectional view of a conventional white light LED 10 encapsulated in silicone.

The active layer of the LED 10 in the example generates blue light. The LED 10 is formed on a starting growth substrate, such as sapphire, SiC, or GaN. Generally, an n-layer 12 is grown followed by an active layer 14, followed by a p-layer 16. The p-layer 16 is etched to expose a portion of the underlying n-layer 12. Reflective metal electrodes 18 (e.g., silver, aluminum, or an alloy) are then formed over the surface of the LED to contact the n and p layers. There may be many distributed electrodes to more evenly spread the current.

When the diode is forward biased, the active layer 14 emits light whose wavelength is determined by the composition of the active layer (e.g., AlInGaN). Forming such LEDs is well known and need not be described in further detail. Additional detail of forming LEDs is described in U.S. Pat. No. 6,828, 596 to Steigerwald et al. and U.S. Pat. No. 6,876,008 to Bhat et al., both assigned to the present assignee and incorporated herein by reference.

The semiconductor LED is then mounted on a submount 22 as a flip chip. The top surface of submount 22 contains metal electrodes that are soldered or ultrasonically welded to the metal electrodes 18 on the LED via solder balls. Other types of bonding can also be used. The solder balls may be deleted if the electrodes themselves can be ultrasonically welded together.

The submount electrodes are electrically connected by vias to cathode and anode pads 24 on the bottom of the submount so the submount can be surface mounted to metal pads on a printed circuit board, which typically forms part of the flash module for a camera. Metal traces on the circuit board electrically couple the pads to a power supply. The submount 22 may be formed of any suitable material, such as ceramic, silicon, aluminum, etc. If the submount material is conductive, an insulating layer is formed over the substrate material, and the metal electrode pattern is formed over the insulating layer. The submount 22 acts as a mechanical support, provides an electrical interface between the delicate n and p electrodes on the LED chip and a power supply, and provides heat sinking. Submounts are well known.

To cause the LED 10 to have a low profile and to prevent light from being absorbed by the growth substrate, the growth substrate is removed, such as by CMP or using a laser lift-off method, where a laser heats the interface of the GaN and growth substrate to create a high-pressure gas that pushes the substrate away from the GaN. In one embodiment, removal of the growth substrate is performed after an array of LEDs is mounted on a submount wafer and prior to the LEDs/submounts being singulated (e.g., by sawing). The final thickness of the semiconductor layers may be about 40 microns. The LED layers plus submount may be about 0.5 mm thick.

Processing of the LED semiconductor layers may occur before or after the LED is mounted on the submount 22.

After the growth substrate is removed, a phosphor layer 30 is formed over the top of the LED for wavelength-converting the blue light emitted from the active layer 14. The phosphor layer 30 may be spray deposited, spun-on, thin-film deposited by electrophoresis, preformed as a ceramic plate and affixed to the top of the LED layers, or formed using any other technique. The phosphor layer 30 may be phosphor particles in a transparent or translucent binder, which may be organic or inorganic, or may be sintered phosphor particles. The light emitted by the phosphor layer 30, when mixed with blue light, creates white light or another desired color. In the example, the phosphor is a yttrium aluminum oxide garnet (YAG) phosphor that produces yellow light (Y+B=white). The phosphor may be any other phosphor or combination of phosphors, such as a red phosphor and a green phosphor (R+G+B=white), to create white light. The thickness of the phosphor layer 30 in all examples may be about 20 microns.

With a YAG phosphor (i.e., Ce:YAG), the color temperature of the white light depends largely on the Ce doping in the phosphor as well as the thickness of the phosphor layer 30.

A silicone encapsulant 32 is then formed over the LED structure to protect the LED and to increase light extraction. In one embodiment, the encapsulant is spun on. In another embodiment, the encapsulant is molded directly over the LED and phosphor. If it is desired to use the encapsulant as a lens, the encapsulant may be shaped using a mold.

The prior art LED structure of FIG. 1 is used as a baseline to show the improved characteristics of the structure when employing the present invention.

Figure 2:
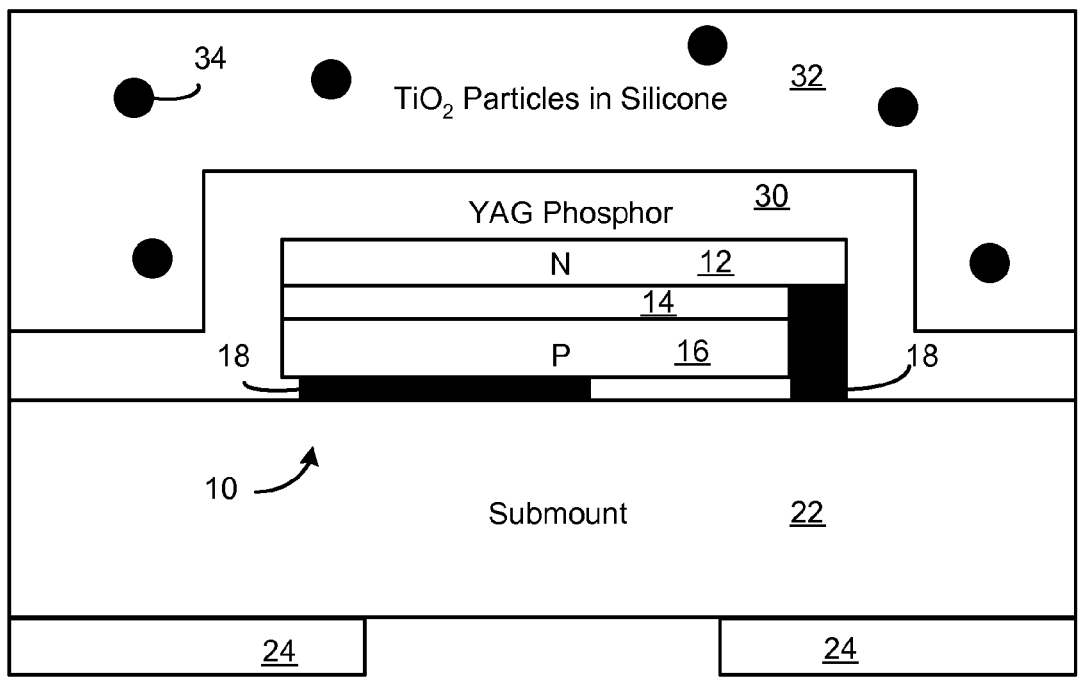
FIG. 2 is a cross-sectional view of a flash LED in accordance with an embodiment of the invention, where $TiO_2$ particles are mixed with the encapsulant.

FIG. 2 is a cross-sectional view of an LED structure which is identical to that of FIG. 1 but where $TiO_2$ particles 34 are mixed with the silicone encapsulant 32 before encapsulating the LED. The optimum quantity of $TiO_2$ may vary anywhere between 1-10% of the weight of the silicone depending on the characteristics of the LED structure. In one embodiment, the encapsulant containing the $TiO_2$ is spun on. In another embodiment, the encapsulant containing the $TiO_2$ is molded directly over the LED and phosphor. If it is desired to use the encapsulant as a lens, the encapsulant may be shaped using a mold.

In one embodiment, the average $TiO_2$ particle size is 0.25 micron, and the particles are randomly shaped. In a typical embodiment, the thickness of the silicone is about 100 microns.

As the weight percentage of the $TiO_2$ is increased to about 5%, the light output of the LED structure increases. In some experiments, the light output diminished after 5%. In one experiment, the light output of the sample was 90 lumens with 0% $TiO_2$, 96 lumens with 5% $TiO_2$, and 93 lumens with 7% $TiO_2$, with the light output lowering thereafter with increasing amounts of $TiO_2$. The color temperature (CCT) also changed with the percentage of $TiO_2$. In one experiment, the CCT was 5815 K with 0% $TiO_2$, 5332 K with 5% $TiO_2$, and 5486 K with 7% $TiO_2$, evidencing that the CCT was lowest at the highest efficiency percentage of $TiO_2$.

In another experiment, the light output of the sample was 145 lumens with 0% $TiO_2$, rising to 154 lumens with only 1% $TiO_2$, which is a 6% increase in light output. In another experiment, a significant increase in light output was seen with only 0.5% $TiO_2$. In another experiment, the light output increased 6% with 5% $TiO_2$. The optimum amount of $TiO_2$ may be determined empirically for each type of LED, the materials used, and the application.

Figure 3:
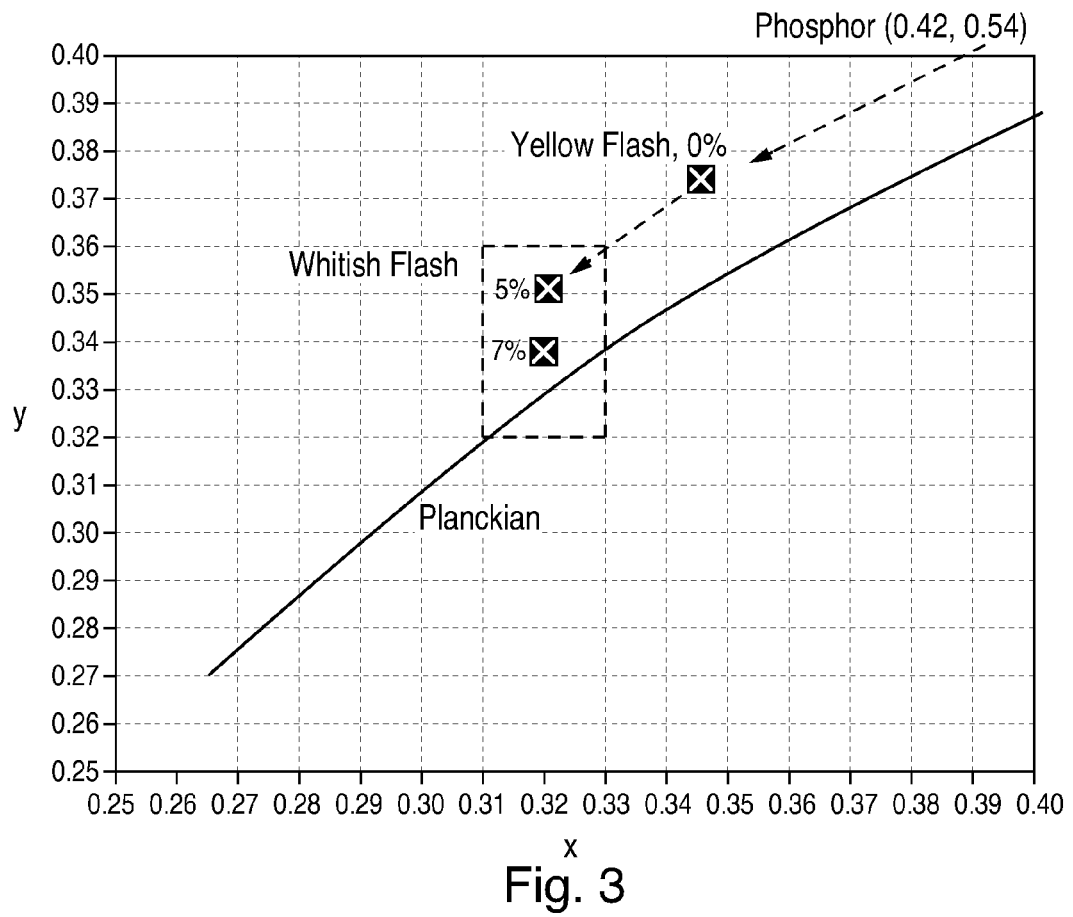
FIG. 3 is a graph illustrating the change in color appearance of the flash in its off state from yellow-green to white by the addition of the $TiO_2$ in the encapsulant.

FIG. 3 is a graph illustrating the change in color appearance of the LED structure of FIG. 2 in its off state plotted using the CIE xy chromaticity system (1931 version). The phosphor is a YAG phosphor. The heated black body curve, also called the Planckian locus, is also shown as a reference, where the coordinate 0.32, 0.33 corresponds to a color temperature of about 5500-6000 K. The LED color becomes generally more yellow-green as the x and y values increase together toward the bulk phosphor color value of 0.42, 0.54 (not plotted). When a thin layer of the phosphor (e.g., about 20 microns) is formed over the LED die and the LED is encapsulated with pure silicone (about 100 microns thick) having 0% $TiO_2$, as shown in FIG. 1, the appearance of the LED (e.g., the flash in a camera) in its off state is a yellow-green color, although less yellow-green than the bulk phosphor. When the encapsulant is mixed with 5% $TiO_2$, the flash is substantially white. When the encapsulant is mixed with 7% $TiO_2$, the flash is even whiter (further away from yellow-green).

Although, at the time of filing this disclosure, the inventors are still analyzing the reasons for the improvement in performance, it is believed that the addition of $TiO_2$ to the encapsulant increases the index of refraction of the encapsulant somewhat and that the color of the $TiO_2$ (white) causes the appearance of the LED/phosphor to be closer to pure white.

Figure 4:
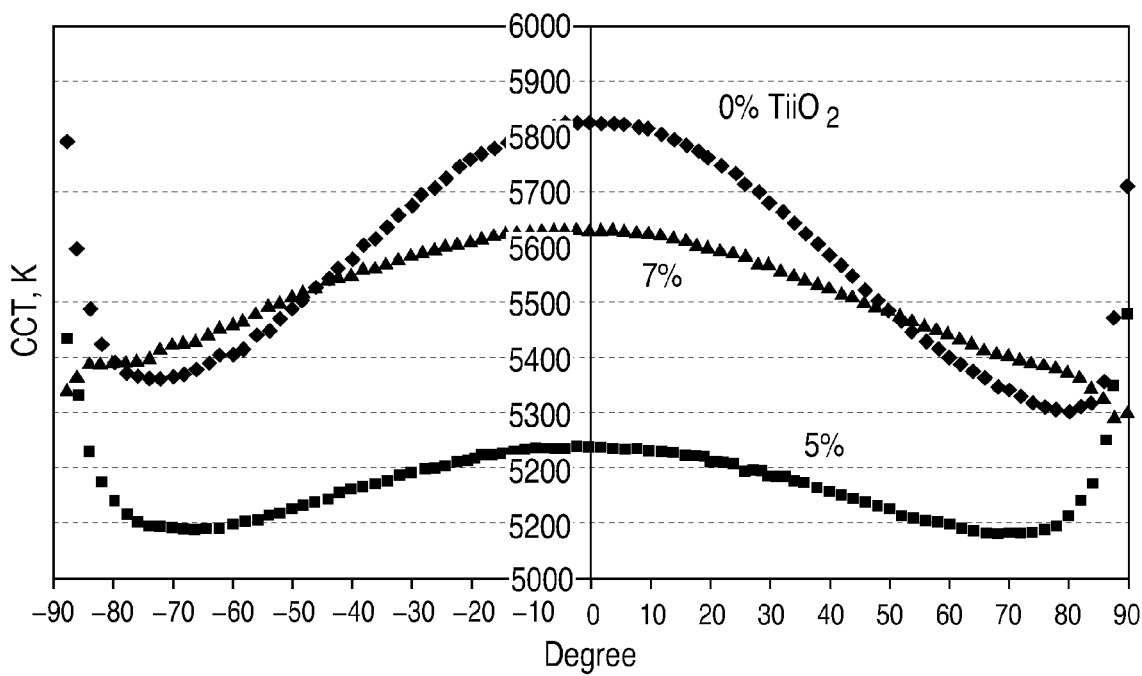
FIG. 4 is a graph illustrating the lowering of the color temperature of the flash in its on state with the addition of the $TiO_2$ in the encapsulant and the lowering of the deviation in color temperature over the viewing angle.

FIG. 4 is a graph of the color temperature of the LED structure of FIG. 2 over a viewing angle of −90 degrees to +90 degrees when the LED is on. The graph illustrates how the color temperature (CCT) of the LED structure of FIG. 2, in its on state, non-linearly varies with the amount of $TiO_2$ added. The desirable lowering of the color deviation over the viewing angle is minimum (about 150 K) for 5% $TiO_2$. This is advantageous for photography since the entire field being photographed is illuminated with substantially the same color flash. The 0% $TiO_2$ plot has very significant deviation, which is about three times the deviation using 5% $TiO_2$. It is believed that the $TiO_2$ particles scatter the light from the LED, which helps to mix the light output to create a more uniform brightness and color over the viewing field.

Instead of $TiO_2$, other whitish inert particles such as $ZrO_2$ may also be used.

Although the invention is particularly desirable for use with LED flashes, since one effect of the $TiO_2$ particles is to whiten the appearance of the yellow-green YAG phosphor over the LED die, the invention also improves the overall light output of LEDs not using a phosphor coating.

Figure 5:
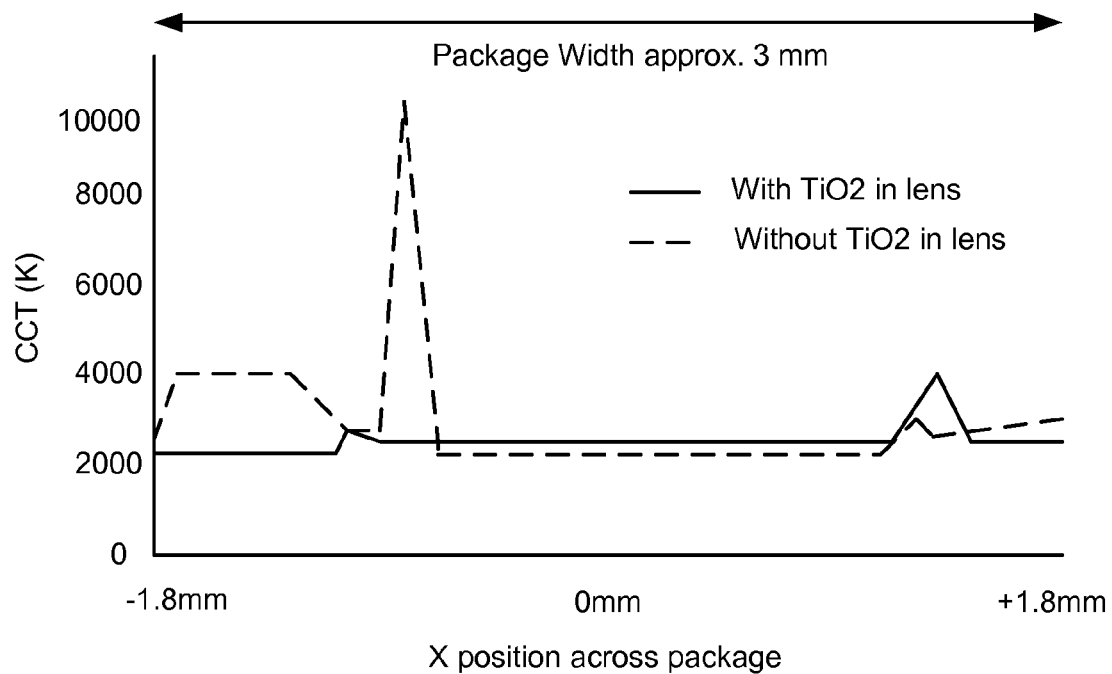
FIG. 5 is a graph illustrating the improvement in color temperature uniformity across the LED package when $TiO_2$ is added to the encapsulant.

The effect of the $TiO_2$ in the encapsulant also effectively filters out significant color variations across the LED package, where the viewing angle is normal to the LED surface. FIG. 5 is a graph approximating actual experimental results, where the color temperature across an LED package (approximately 3 mm across) was measured. The measurements were taken on an LED having no $TiO_2$ in the encapsulant and on a similar LED having $TiO_2$ in the encapsulant. The encapsulant formed an overmolded hemispherical lens over the LED. The LED was a blue LED with a phosphor plate affixed to the top of the LED chip, where the phosphor in combination with the blue light leaking through generated an orange emission. The phosphor plate did not cover the edges of the LED layers.

As seen in the graph of FIG. 5, near the left edge of the LED without the $TiO_2$ in the encapsulant, there is a color temperature spike due to the unconverted blue light from the edge of the LED being emitted. The right side has a less severe increase in color temperature near the edge of the LED. Had the LED been used in a flashlight or projector where optics greatly enlarge the LED image, the blue color near the edge would be visible in the projected image. In contrast, as seen in the measurement of the color temperature of the LED with the $TiO_2$ in the encapsulant, there is no significant spike in color temperature near the edge of the LED since the $TiO_2$ effectively filters out any spikes.

Figure 6:
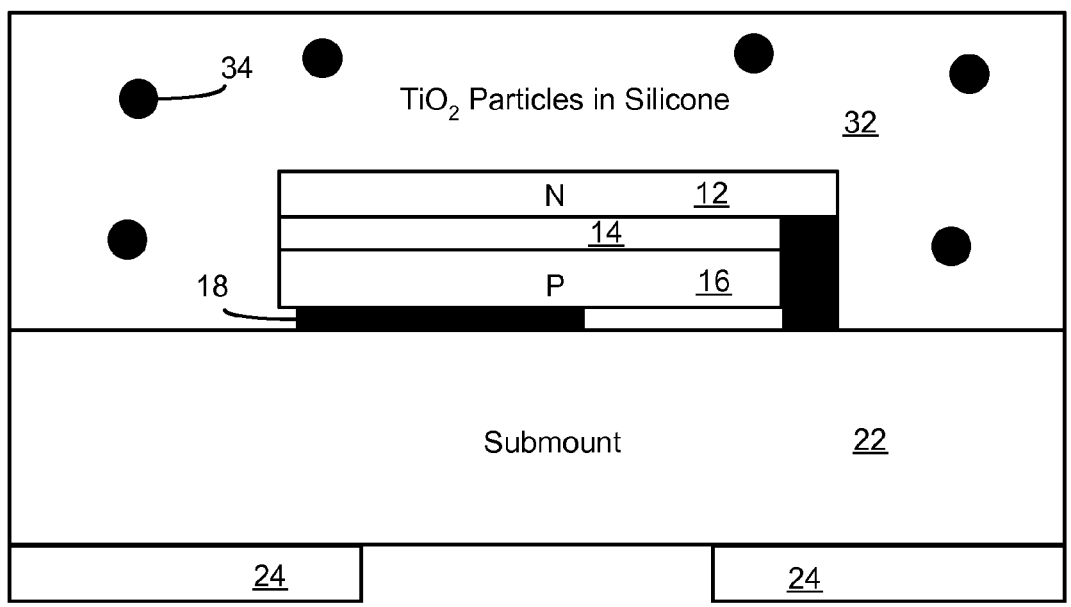
FIG. 6 is a cross-sectional view of a blue LED die without a phosphor coating in accordance with an embodiment of the invention, where $TiO_2$ particles are mixed with the encapsulant.

FIG. 6 is a cross-sectional view of an LED die, without a phosphor layer, with $TiO_2$ particles 32 mixed with the silicone encapsulant 32. The LED die emits blue light. All aspects of the LED except for the phosphor layer are identical to FIG. 2.

Figure 7:
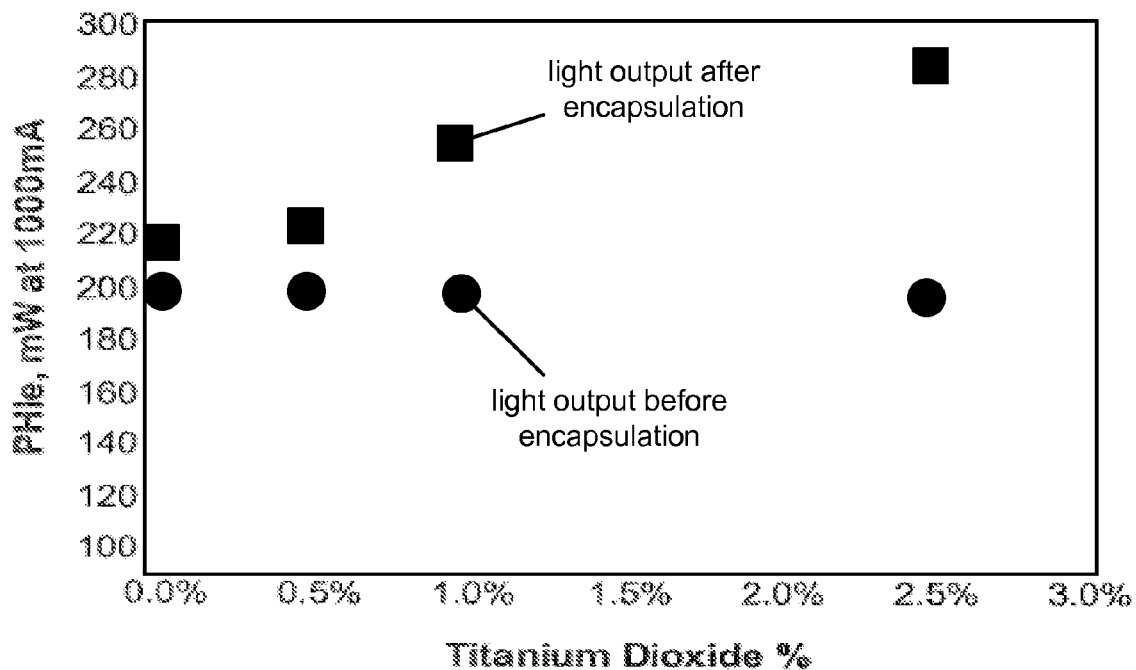
FIG. 7 is a graph of the light power output of the LED of FIG. 5 showing the improvement of power output with an increase in the amount of $TiO_2$ in the encapsulant.

In the graph of FIG. 7, the square data points represent the light output power (in mW) of the LED structure of FIG. 6 versus the percentage of $TiO_2$ in the encapsulant at 1000 mA driving current. The circles are reference data points showing the light output power of the LED die without an encapsulant. The data point at 0% is estimated; the other data points were measured. As seen, incorporating $TiO_2$ particles in the encapsulant over the bare LED die significantly increases the light output power of the LED, even when the amount of $TiO_2$ is about 0.5%.

Figure 8:
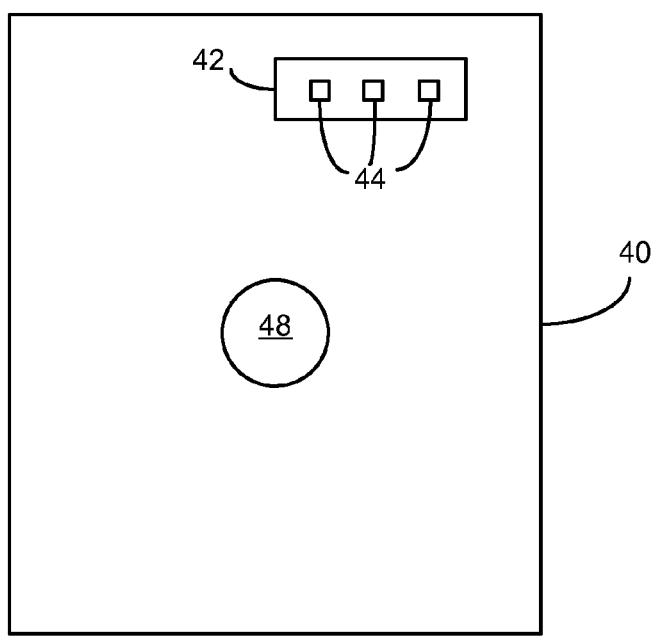
FIG. 8 is a front view of a camera, having a flash in accordance with one embodiment of the invention, where $TiO_2$ particles are mixed with the encapsulant.

FIG. 8 is a representation of a camera 40, which may be a cell phone camera, using the invention described herein. The flash module 42 comprises three blue emission LEDs 44, for increased light power output, mounted on a single submount, which is mounted on a circuit board. A YAG phosphor layer covers the LEDs. An ESD protection circuit may also be mounted on the submount and covered by the phosphor. The LEDs, phosphor, and ESD circuit are encapsulated with silicone mixed with $TiO_2$ to achieve the benefits described herein. A camera lens 48 is also shown.

Tests have shown no reduced reliability of the LED structures with the addition of the inert particles in the encapsulant.

An additional use of the $TiO_2$ or $ZrO_2$ particles in the encapsulant may be to block or reflect light by the encapsulant. By increasing the percentage of the particles over 10%, the reduction in transmission through the encapsulant becomes very significant (from 90% transmission with 0% $TiO_2$ to 25% transmission with 10% $TiO_2$). If the percentage of the particles keeps increasing, the encapsulant becomes more and more like a diffusing reflector, reflecting most light back into the LED and out the sides. Such a side-emitting LED is useful in certain applications such as LCD backlights. In one embodiment, the percentage of the particles exceeds 25% to create a substantially side-emitting LED.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A light emitting device comprising:
a semiconductor light emitting diode (LED);
a layer of phosphor over the LED; and
an encapsulant over the LED and phosphor directly contacting the phosphor, the encapsulant comprising a substantially transparent material containing only inert non-phosphor, the particles being between 0.5%-5% by weight of the encapsulant, the particles having a substantially white color under white ambient light
an average diameter of the particles is less than one micron.

2. The device of claim 1 wherein the particles comprise $TiO_x$.

3. The device of claim 2 wherein the particles comprise $TiO_2$.

4. The device of claim 1 wherein the particles comprise $ZrO_x$.

5. The device of claim 4 wherein the particles comprise $ZrO_2$.

6. The device of claim 1 wherein the particles comprise between 2.5% and 5% of the encapsulant.

7. The device of claim 1 wherein the encapsulant comprises silicone.

8. The device of claim 1 wherein the encapsulant has a substantially flat surface over the LED.

9. The device of claim 1 wherein the phosphor is over at least a top surface of the LED, the phosphor having a yellowish color under white ambient light, the encapsulant, containing the particles, whitening an appearance of the phosphor when the LED is in an off state.

10. The device of claim 9 wherein the phosphor comprises a yttrium aluminum oxide garnet (YAG) phosphor.

11. The device of claim 1 wherein the particles increase light output power out of the encapsulant when the LED is in an on state, compared to the encapsulant having 0% of the particles.

12. The device of claim 1 wherein the particles lower a color temperature of light output from the encapsulant when the LED is in an on state, compared to the encapsulant having 0% of the particles.

13. The device of claim 1 wherein the particles lower a deviation of color temperature versus viewing angle of light output from the encapsulant when the LED is in an on state, compared to the encapsulant having 0% of the particles.

14. The device of claim 1 wherein the particles lower a deviation of color temperature versus position normal to a top surface of the LED when the LED is in an on state, compared to the encapsulant having 0% of the particles.

15. The device of claim 1 wherein the LED and encapsulant comprise a flash light source in a camera.

16. The device of claim 1 wherein a semiconductor portion of the LED emits blue light.

* * * * *